(12) United States Patent
Lewis, III et al.

(10) Patent No.: US 6,752,868 B2
(45) Date of Patent: Jun. 22, 2004

(54) LAYER-BY-LAYER ASSEMBLY OF PHOTONIC CRYSTALS

(75) Inventors: John South Lewis, III, Durham, NC (US); Scott Halden Goodwin-Johansson, Pittsboro, NC (US); Brian Rhys Stoner, Chapel Hill, NC (US); Sonia Grego, Carrboro, NC (US); David Edward Dausch, Raleigh, NC (US)

(73) Assignee: MCNC Research & Development Institute, Research Triangle Park, NC (US)

( * ) Notice: Subject to any disclaimer, the term of this patent is extended or adjusted under 35 U.S.C. 154(b) by 0 days.

(21) Appl. No.: 10/210,010

(22) Filed: Jul. 31, 2002

(65) Prior Publication Data

US 2004/0020423 A1 Feb. 5, 2004

(51) Int. Cl.[7] .............................................. C30B 29/54
(52) U.S. Cl. .............................. 117/68; 117/69; 117/70; 117/902; 117/913; 117/925; 117/926; 117/927; 428/333; 428/336; 428/411.1
(58) Field of Search ............................. 117/68, 69, 70, 117/913, 902, 925, 926, 927; 428/333, 336, 411.1

(56) References Cited

U.S. PATENT DOCUMENTS

| 6,287,765 B1 | 9/2001 | Cubicciotti |
| 6,410,416 B1 | 6/2002 | Dodabalapur et al. |
| 2002/0045030 A1 | 4/2002 | Ozin et al. |
| 2002/0068018 A1 | 6/2002 | Pepper et al. |

OTHER PUBLICATIONS

Sun et al., "Photonic Gaps in Reduced–Order Colloidal Particulate Assemblies", Jpn. J. Appl. Phys Vol 39 2000 pp. L591–L594.*
Zhou et al., "Three dimensional photonic band gap strucutre of a polymer metal composite", Applied Physics letters vol. 76 No. 23 pp. 3337–3339 Jun. 2000.*
Kim et al., "DNA assisted 2D photoni crystal fabrication", Polymeric Materials Science and Engineering vol 89 p. 129 2003.*
"Layer–by–Layer Growth of Binary Colloidal Crystals", Velikov, et al., Apr. 5, 2002, Vol 296, Science, pp106–109
TechNote 190 205—Covalent Coupling, Bangs Laboratories, Inc., Rev. #002, Aug. 31, 1999, pp 1–10.
"Self–assembled Heterostructures Based on Magnetic Particles for Photonic Bandgap Applications", Saado et al., Optical Materials, Elsevier Science Publishers B. V. Amsterdam, NL, vol. 17, No. 1–2, Jun. 2001 (Jun. 2001), pp. 1–6, XP004254779, ISSN:0925–3467.

* cited by examiner

*Primary Examiner*—Robert Kunemund
(74) *Attorney, Agent, or Firm*—Miller Patent Services; Jerry A. Miller

(57) ABSTRACT

A three dimensional photonic crystal and layer-by-layer processes of fabricating the photonic crystal. A templated substrate is exposed to a plurality of first microspheres made of a first material, the first material being of a type that will bond to the templated substrate and form a self-passivated layer of first microspheres to produce a first layer. The first layer is exposed to a plurality of second microspheres made of a second material, the second material being of a type that will bond to the first layer and form a self-passivated layer of second microspheres. This layering of alternating first and second microspheres can be repeated as desired to build a three dimensional photonic crystal of desired geometry.

55 Claims, 7 Drawing Sheets

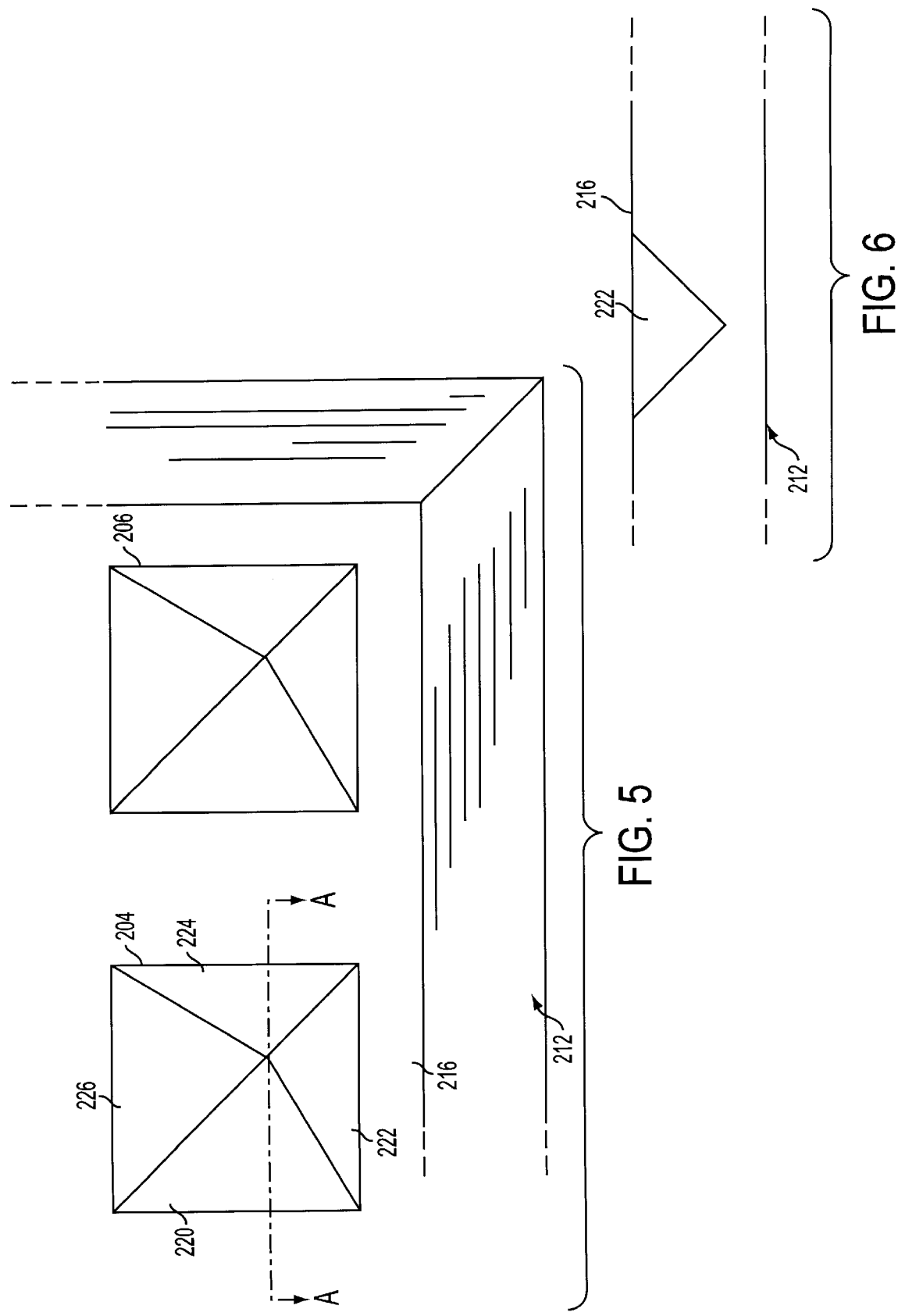

LAYER-BY-LAYER ASSEMBLY OF PHOTONIC CRYSTALS

STATEMENT OF U.S. GOVERNMENT RIGHTS UNDER 35USC 202(c)(6)

The U.S. government has a paid-up license in this invention and the right in limited circumstances to require the patent owner to license others on reasonable terms as provided for by the terms of contract number N66001-01-1-8938 awarded by the United States Defense Advanced Research Project Agency.

FIELD OF THE INVENTION

This invention relates generally to the field of photonic crystals. More particularly, this invention relates to a photonic crystal structure and a method for layer-by-layer fabrication of such crystal structure.

BACKGROUND OF THE INVENTION

Photonic crystals are being actively pursued as components in optical networks, such as wavelength-division multiplexing applications. Examples of potential applications are as filters, mirrors, waveguides, and prisms. Added functionality could allow the crystals to be used in other applications such as frequency-tunable filters, optical switches, chemical and biological recognition systems, as well as other potential applications.

Three dimensional (3-D) photonic crystals have been made using a number of approaches. One common approach uses a colloidal technique that allows a distribution of spheres (e.g. microspheres—typically spheres approximately in the range of 90 nm to several microns in diameter) to settle out of solution into a bulk 3-D crystal. A similar approach uses the surface tension of a moving liquid/gas interface, created by either by pulling a substrate out of a liquid or by evaporating the liquid, to create a 3-D crystal made of up microspheres. Both techniques result in a close-packed structure of identical spheres. More complex structures are possible if differently sized spheres are used, but there is very little external control over the crystallization process and the resulting structure. The spheres can be made with a number of different materials, with polystyrene a common example, and the components are uniform in size and composition. Crystals fabricated using this technique are mechanically unstable unless a matrix such as a polymer matrix is used between the spheres to mechanically reinforce the structure.

SUMMARY OF THE INVENTION

The present invention relates generally to photonic crystals. Objects, advantages and features of the invention will become apparent to those skilled in the art upon consideration of the following detailed description of the invention.

In general terms, without any intention of limiting the invention, the present invention, in certain embodiments, relates to a technique which can be used to fabricate photonic crystals in a controlled, layer-by-layer manner. This allows control over parameters not possible with traditional colloidal techniques and permits novel crystal structures to be created.

In one exemplary embodiment consistent with the present invention a three dimensional photonic crystal is fabricated starting with a templated substrate that is exposed to a plurality of first microspheres made of a first material, the first material being of a type that will bond to the templated substrate and form a self-passivated layer of first microspheres to produce a first layer. The first layer is exposed to a plurality of second microspheres made of a second material, the second material being of a type that will bond to the first layer and form a self-passivated layer of second microspheres. This layering of alternating first and second microspheres can be repeated as desired to build a three dimensional photonic crystal of desired geometry.

A method of fabricating a photonic crystal, consistent with certain embodiments of the present invention involves providing a templated substrate; and exposing the templated substrate to a plurality of first microspheres made of a first material, the first material being of a type that will bond to the templated substrate and form a self-passivated layer of first microspheres to produce a first layer. A second layer can be created by exposing the first layer to a plurality of second microspheres made of a second material, the second material being of a type that will bond to the first layer and form a self-passivated second layer of second microspheres.

Another method of fabricating a photonic crystal consistent with certain embodiments of the present invention involves providing a templated substrate; exposing the templated substrate to a plurality of first microspheres made of a first material, the first material being of a type that will bond to the templated substrate and form a self-passivated layer of first microspheres to produce a layer of microspheres; modifying the first layer of microspheres to permit the first layer of microspheres to bond with other microspheres to thereby produce a bondable layer; exposing the bondable layer to a plurality of second microspheres to form a second layer of microspheres. The second layer of microspheres can be made of the first material or of a second material.

A photonic crystalline structure consistent with certain embodiments of the present invention has a templated substrate processed to bond preferentially to a first material in selected areas. A first layer of first microspheres, the first layer being one microsphere deep, is made of a material that bonds to the selected areas of the templated substrate. A second and subsequent layers can be added wherein the second and subsequent layers of microspheres can be made of the first material or of a second material.

The above summaries are intended to illustrate exemplary embodiments of the invention, which will be best understood in conjunction with the detailed description to follow, and are not intended to limit the scope of the appended claims.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 5 is a perspective view of a substrate having etched inverted pyramids in an upper surface thereof consistent with certain embodiments of the present invention.

FIG. 6 is a side cutaway view of an etched inverted pyramid along lines A—A of FIG. 5 consistent with certain embodiments of the present invention.

DETAILED DESCRIPTION OF THE INVENTION

Figure 1:
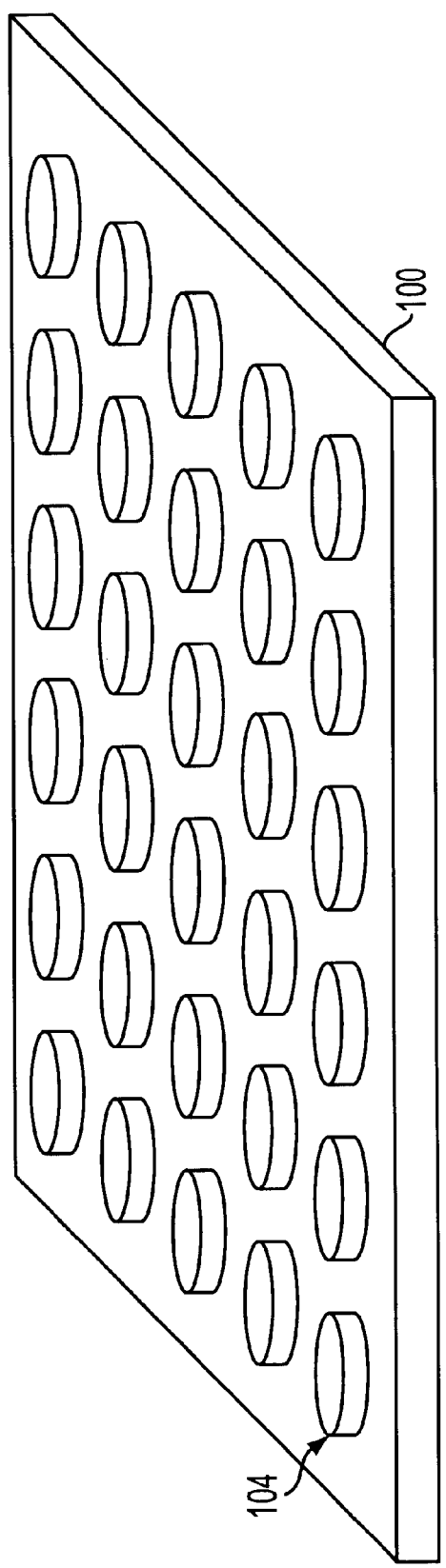
FIG. 1 illustrates an exemplary substrate consistent with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

The current invention, in its many embodiments, offers several approaches that could be used to build a photonic crystalline structure in a layer-by-layer fashion. This has the potential of improving the quality of the resultant crystals, but also offers the ability to engineer the structure of the crystal using spheres with varying properties, and substrates patterned to achieve varying effects.

One method consistent with certain embodiments of the present invention uses a type of biological recognition as a method for fabricating multi-layer structures in a selective manner. The detailed example provided below focuses on using biotin- and streptavidin-coated microspheres as the basis for the photonic crystals. Streptavidin is a protein while biotin is a vitamin. These are well-known molecules which bond with one another in a biological bond with a strength approaching that of a covalent bond, but the spheres do not tend to bond to themselves (aggregate). Other types of biological recognition such as protein to protein, DNA to DNA, etc. will be described later. These coated microspheres are readily available commercially, and are commonly used in the process of fluorescence microscopy to indicate the presence of other proteins.

In accordance with certain embodiments of the present invention, a layer-by-layer approach is taken to fabrication of a photonic crystal. Many variations of techniques consistent with the current teachings are possible without departing from the invention. One embodiment using the above-mentioned biotin- and streptavidin coated spheres is illustrated in FIGS. 1–4 wherein a three layer photonic crystal is constructed using such microspheres. In this exemplary embodiment, alternating layers are constructed using biological bonds (i.e., protein bonds) to secure the layers together and to a substrate. Turning first to FIG. 1, a substrate 100 is "templated" or "patterned" to capture microspheres of the desired size in a desired arrangement. In this simple example, the templating is done by starting with a metal coated substrate (e.g., a gold plated substrate) and etching away metal to form regularly spaced disks of metal such as 104 using any suitable etching technique.

Suitable substrates can be devised of many types of materials including, but not limited to, glass, quartz, silicon, germanium, gallium arsenide, photoresist, ceramic, epoxies, polymers, plastics, and metals. The main consideration, from the perspective of actual layer-by-layer fabrication of the photonic crystal, is that the substrate have a surface for bonding of the microspheres which is very smooth in comparison with the size of the microspheres.

The disks 104 are sized to accommodate a single layer of microspheres with a single microsphere centered on each disk 104. Thus, if 2.0 micron diameter microspheres are used, the disks would be spaced 2.0 microns apart center to center. The templating technique used, of course, should be matched to the resolution required to achieve the precision needed to accommodate a particular size of microspheres. The substrate can be of any suitable material such as previously described.

For this exemplary embodiment, the metal disks remaining from the etching are then treated to make them suitable for bonding with the desired first layer of microspheres. In the present exemplary embodiment, the first layer can be made of streptavidin-coated microsphere beads (available from Bangs Laboratories, Inc., 9025 Technology Drive, Fishers, Ind. 46038 and other commercial sources). Thus, in the present example, to permit bonding with the streptavidin-coated microspheres the disks 104 are first plated with gold and then biotinylated using any known process for biotinylating gold. In other embodiments, any mechanism for biotinylating a specified region of the substrate can be used to create regions of preferential bonding for the streptavidin-coated microspheres. Since streptavidin readily forms a biological bond with biotin, but will not bond with itself, a first layer of microspheres can be applied to the substrate by suspending the microspheres in a colloidal solution or slurry and bringing the solution or slurry into contact with the templated substrate 100. This produces a single layer of streptavidin microspheres. Since streptavidin spheres do not readily bond to themselves, this layer is referred to herein as "self-passivated". That is, once the single layer is formed, other streptavidin spheres do not tend to bond to the single layer. (Other equivalent techniques could hypothetically involve applying microspheres that do not explicitly self-passivate, if excess microspheres can then be removed to leave a single layer. Such equivalents to self passivated layers are contemplated by the present invention.)

Figure 2:
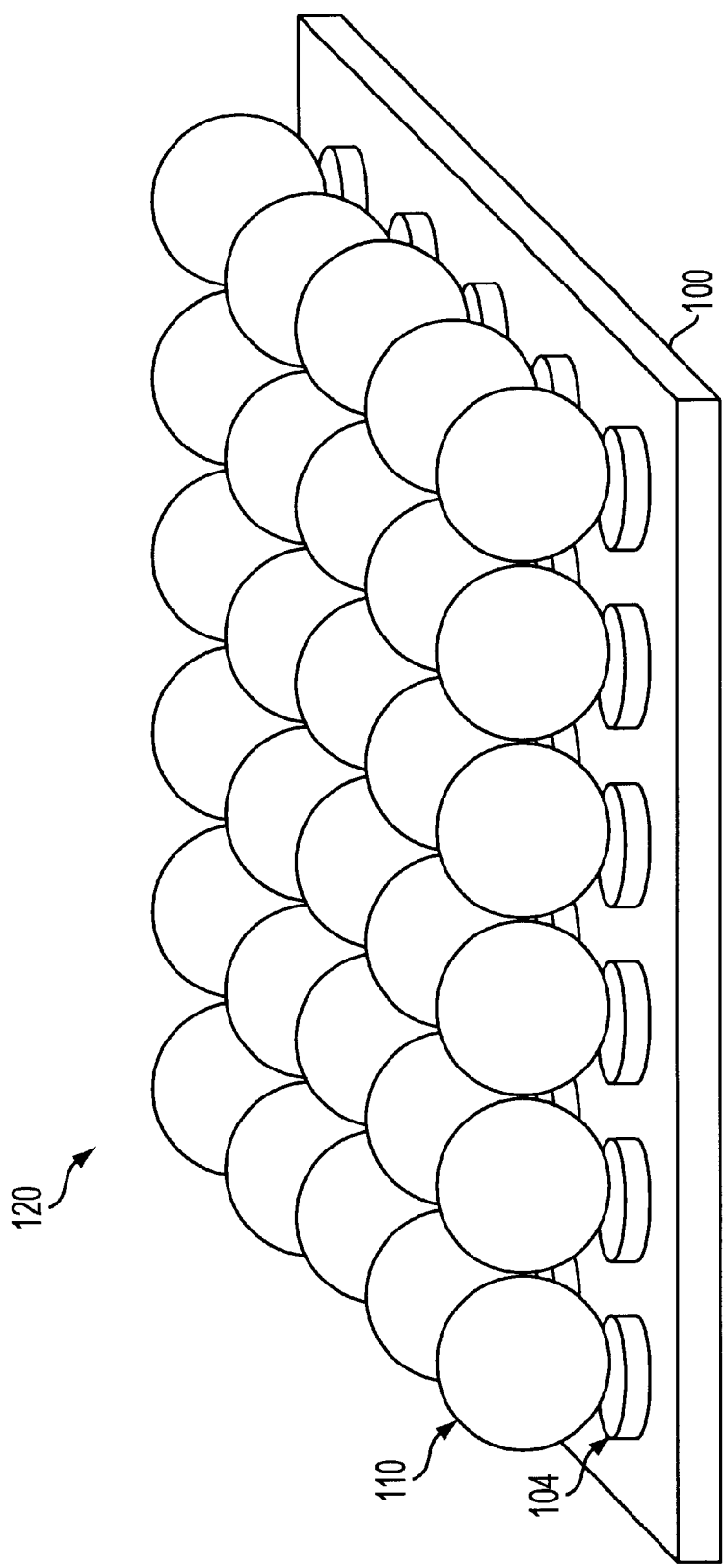
FIG. 2 illustrates a single layer of microspheres bonded to the substrate 100 in a manner consistent with certain embodiments of the present invention to create a single layer photonic crystal.
Figure 3:
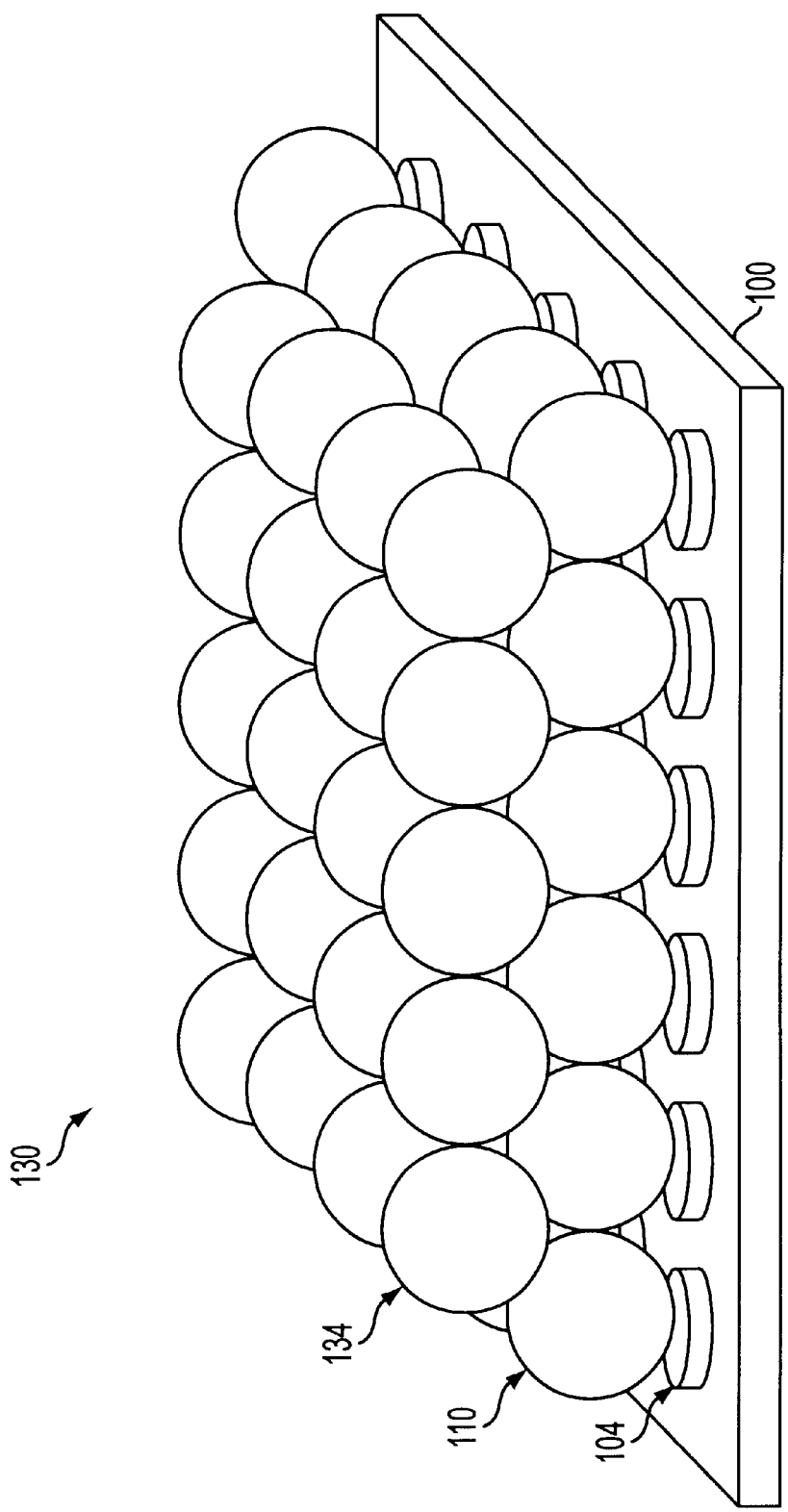
FIG. 3 illustrates a two layer photonic crystalline structure of microspheres fabricated on the substrate 100 in a manner consistent with certain embodiments of the present invention.

Many variables are possible in this step, including but not limited to, the temperature, PH, slurry concentration, agitation, composition of the liquid component of the slurry and contact time. These variables can be optimized by experimentation to achieve a desired coating of a single layer of microspheres such as illustrated in FIG. 2. In this figure, the streptavidin-coated microspheres 110 preferentially situate themselves in a single layer with the disks 104 and bond to the disks with a very strong protein bond. That is, a layer of microspheres which is one microsphere deep is deposited on the substrate and bonds therewith.

Once a complete layer of the streptavidin-coated microspheres 110 is bonded to the array of disks 104, the remaining streptavidin-coated microspheres present in the slurry or solution have nowhere to bond and can be readily rinsed away, for example with a water rinse (and potentially reused). At this stage, a single layer photonic crystalline structure 120 is formed and is precisely a single layer of microspheres in thickness above the substrate 100.

In order to continue building a thicker photonic crystal, a second layer (again one microsphere deep) can be added. In this example, a second layer of streptavidin-coated microspheres will not bond to the first layer of streptavidin-coated microspheres 110. A second layer, however, can be constructed using a complementary type of microsphere that will form a protein bond with the streptavidin-coated microspheres 110 as illustrated by the two layer photonic crystal illustrated as 130 in FIG. 3. In order to apply a second layer of microspheres, biotin coated microspherical beads 134 of the same size as the streptavidin-coated microspheres 110 are used (also available from Bangs Laboratories, Inc., 9025 Technology Drive, Fishers, Ind. 46038 and other commercial sources). The biotin coated microspheres 134 are again placed in a suitable slurry and the single layer photonic crystal 120 is exposed to the slurry (again with variables such as the temperature, PH, slurry concentration, agitation, composition of the liquid component of the slurry and contact time optimized by experimentation to achieve a desired coating of a single layer of biotin coated microspheres 134 bonded to the streptavidin-coated microspheres 110). Under suitable conditions, the second layer will form a strong biological bond with the first layer in a single layer mechanical arrangement as illustrated. The packing of the second layer is provided by the topographic features of the first layer of spheres (110), wherein multiple bonding surfaces (four surfaces in the example shown in FIG. 3) are available to the second layer at the points between spheres, providing the most stable arrangement. In addition to a larger number of bonding surfaces, the reduced amount of Brownian fluid forces on the microsphere once it is located in a recessed area will assist in stabilizing the second layer in an arrangement consistent with that of the first layer. Thus the packing of the second layer 134 is determined by the pattern provided by the first layer 110, such that a variety of three-dimensional structures can be obtained by modifications to the arrangement of microspheres in the first layer. As with the first layer, the second layer self-passivates when no more spaces are available on the first layer of streptavidin-coated microspheres 110 for bonding by the biotin coated microspheres 134. The remaining biotin coated microspheres in the slurry can then be rinsed away. Thus, the second layer is formed to produce a two layer photonic crystal structure 130.

Figure 4:
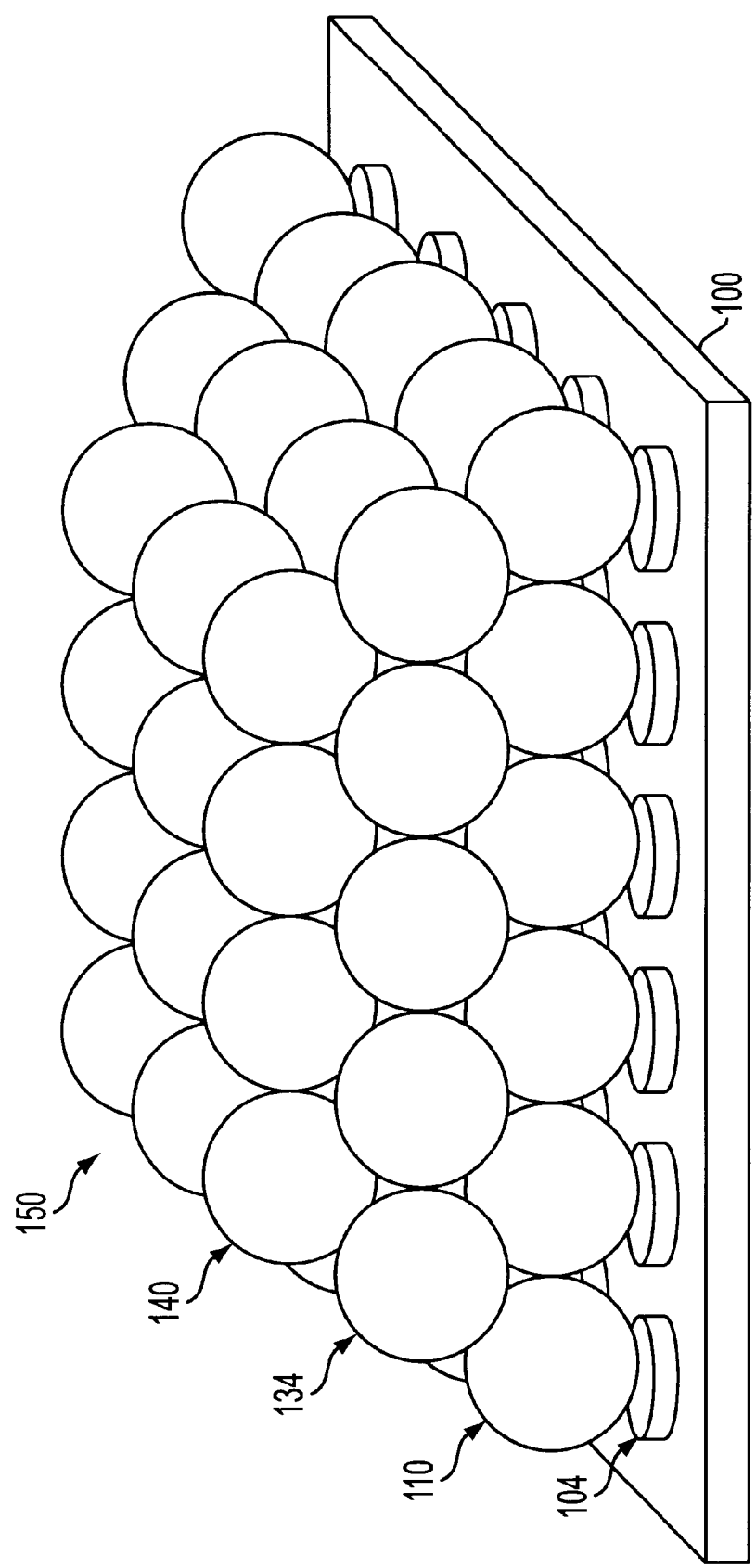
FIG. 4 illustrates a three layer photonic crystalline structure of microspheres fabricated on the substrate 100 in a manner consistent with certain embodiments of the present invention.

A third layer can be fabricated using a similar technique to that of the first layer. To form the third layer, streptavidin-coated microspheres are again used since they will bond with the biotin coated microspheres 134 of the second layer with a protein bond. Since streptavidin readily forms a protein bond with biotin, but will not bond with itself, a third layer of microspheres can again be applied to the substrate by placing the streptavidin microspheres in a liquid solution or slurry and bringing the slurry into contact with the two layer photonic crystal 130. Again, many variables are possible in this step, including but not limited to, the temperature, PH, slurry concentration, agitation, composition of the liquid component of the slurry and contact time. These variables can be optimized by experimentation to achieve a desired coating of a single layer of microspheres 140 (one microsphere deep) bonded to the layer of microspheres 134 such as illustrated in FIG. 4. In this figure, the streptavidin-coated microspheres 140 preferentially situate themselves in a single layer with the microspheres 134 and bond to the microspheres 134 with a very strong protein bond. Once a complete layer of the streptavidin-coated microspheres 140 is bonded to the layer of microspheres 134, the remaining streptavidin-coated microspheres present in the slurry have nowhere to bond and can be readily rinsed away and potentially reused. At this stage, a three layer photonic crystal 150 is formed.

This process can be repeated sequentially building layer after layer of alternating streptavidin-coated microspheres and biotin-coated microspheres to form a desired sized and shaped crystalline structure.

Initial experiments have been conducted to fabricate a photonic crystal using the above-described method. Results show that the two types of microspheres do in fact preferentially bond with one another, and that a two-layer structure can be deposited on a glass slide serving as an unpatterned substrate. In these experiments, this was accomplished by bonding streptavidin coated spheres to a glass slide to create an unpatterned irregular monolayer by placing a drop of water containing 1% solids (1 mg of microspheres per 100 mL of water) in a chamber on a glass slide created by bordering a section of the slide with tape and placing a cover over the section. The streptavidin spheres naturally bond to glass to create an irregular monolayer of streptavidin. After flushing away excess streptavidin-coated spheres with water, this monolayer was then exposed to a 1% solids solution (again 1 mg of solids per 100 milliliters of water) of biotin-coated microspheres at room temperature for 30 seconds to five minutes. In this example, the substrate and thus the layers are not patterned, so the result was a two-layer random arrangement of microspheres. Experimental results show that higher concentrations of the spheres in the solution, and longer waiting time for the solution to settle (without agitation) resulted in higher concentration of deposited and bonded spheres. The experiments suggest that use of a patterned or templated substrate as described above would permit engineering of the mechanical structure in the layer-by-layer fashion described above.

Selection of an appropriate substrate material depends upon the type and size of microsphere and type of bonding to be used to assemble the layers, as well as the patterning or templating to be used.

Patterning the substrate to control the first layer of microspheres may present a technical challenge, depending on the size of the microspheres to be used, but substrate templating has been demonstrated in the literature for colloidal assembly approaches, and templating the substrate with respect to the present method should not present any new challenges. The continuous improvements in the ability to pattern substrates are expected to permit smaller and smaller microspheres to be used. The particular approach used to pattern or template the substrate depends, in part, on the type of chemistry used for bonding the microspheres together.

Many methods could potentially be used to template the substrate. Generally, methods of templating the substrate that can potentially be used include chemical patterning, physical patterning, or a combination of the two.

Physical patterning of the topography of the substrate can also potentially be used, for example, as illustrated in FIGS. 5 and 6. One approach to physical patterning would use anisotropic etching of periodic inverted pyramids such as 204 and 206 into the substrate 212 at an upper surface 216 thereof. Using four sided pyramids, such as pyramid 204 this would give the microspheres four bonding sites at each of the etched surfaces 220, 222, 224 and 226 in the pyramid rather than just one on a plane surface such as the upper surface 216, and it is expected that the spheres would preferentially settle and bond inside the pyramids such as 204 and 206. Inverted pyramidal shapes having three or more sides can be used without departing from the present invention. Moreover, pyramids are only one shape that could be etched or otherwise milled into a substrate to provide multiple bonding sites that spheres would likely consider preferential to a single surface site. Other techniques, such as isotropic etching; mechanical machining; molding; micro-contact printing; UV, deep UV, x-ray, electron beam, or ion beam lithography; ion beam milling; holographic patterning; two-photon polymerization; or some other suitable technique can also equivalently be used, in appropriate combinations if necessary, to pattern a surface of the substrate.

Topographical patterning generally uses a substrate with uniform chemical composition, but this should not be considered limiting since many exceptions can be conceived. The topographical patterns provide preferential bonding sites for the beads based on physical topography. Examples are rounded or pyramidal recesses in the substrate surface. The recesses give larger areas for bonding or additional surfaces for formation of bonds between the microspheres and the substrate.

Chemical selectivity can be used to template the substrate by creating local regions of the substrate where the microspheres tend to bond with the substrate by use of a chemical with appropriate bonding properties. The remainder of the substrate can be made of a different material. One example would be to use a background material which does not bond with streptavidin-coated beads, such as photoresist. Adjacent to the photoresist, regions are patterned which will form bonds with streptavidin coated beads. Examples of such regions could include biotinylated surfaces such as gold, or other surfaces such as glass, silicon, silicon dioxide, silicon nitride, etc. Chemical selectivity in this context also includes bonding due to electrostatic or ionic attraction. Many other examples may occur to those skilled in the art upon consideration of this teaching.

A hybrid of chemical selectivity and topographical patterning can also be used. In one example of such a hybrid approach, streptavidin-coated beads adhere to such surfaces as glass, silicon, silicon dioxide, silicon nitride, and gold. They do not adhere well to certain types of photoresist. Patterning holes in the photoresist (via traditional UV or electron beam lithography) results in a structure that is chemically selective, and the height of the residual photoresist provides a degree of physical templating as well. Either chemical selectivity or physical templating of the substrate can potentially, but not necessarily, be adaptable to include intentional defects into the crystal structure if desired.

Thus, methods consistent with embodiments of the present invention can use forming a geometric pattern in the substrate material to create preferential bonding regions on the substrate, forming three-dimensional topography on a surface of the substrate to create preferential bonding regions within the topography, forming inverted pyramid shaped recesses on a surface of the substrate material to create preferential bonding regions within the inverted pyramids or chemically treating the substrate to create preferential bonding regions on the substrate. In addition, combinations of these techniques can be used such as creating preferential bonding regions on the substrate by a combination of chemical and topographical patterning. Other techniques may occur to those skilled in the art upon consideration of the present invention.

Figure 7:
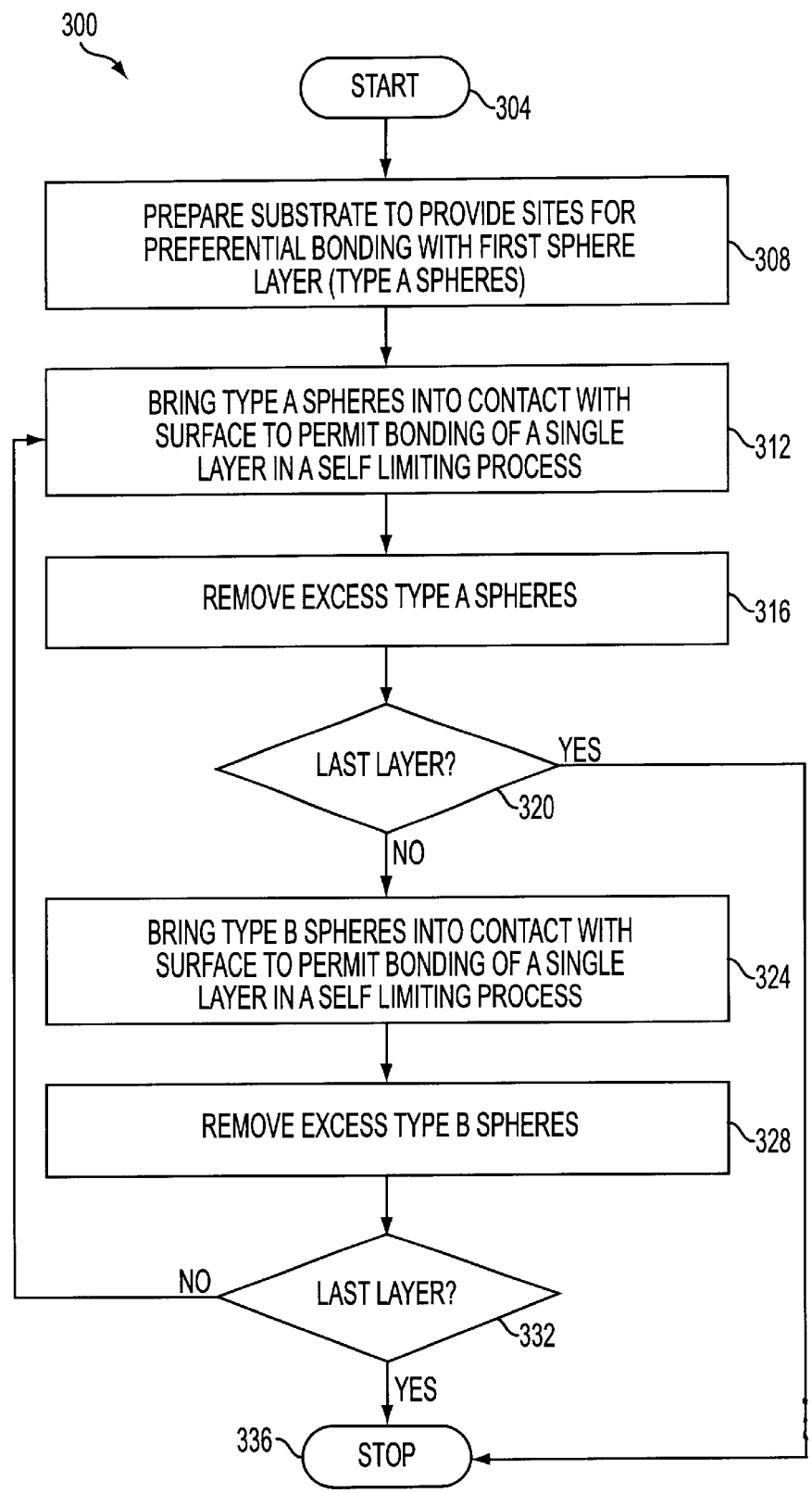
FIG. 7 is a flow chart depicting a process for layer-by-layer fabrication of a photonic crystalline structure consistent with certain embodiments of the present invention.

The above process, as depicted in FIGS. 1–4, is outlined in flow chart 300 of FIG. 7 starting at 304. A suitable substrate is prepared or obtained at 308 so that spheres of a particular type (type A in this example) will bond to the substrate in a manner dictated by the patterning or templating of the substrate. It is hypothesized that a suitable bond can result from many types of bonding and attraction phenomenon such as covalent bonding, electrostatic attraction, metallic bonding, hydrogen bonding (electrostatic attraction between an electronegative atom and a hydrogen atom that is bonded covalently to a second electronegative atom), Van der Waals forces, hydrophobic/hydrophillic attractions (hydrophobic attractions cause non-polar groups such as hydrocarbon chains to associate with one another in an aqueous environment), biological recognition such as protein-protein/protein-ligand complexes (e.g., antigen-antibody), DNA or RNA hybridization or ligand-receptor (e.g., enzyme-substrate) (biological recognition generally results from a three dimensional structure that allows multiple weak forces between molecules), or some combination of the above forces, or any other suitable bond. The spheres of type A are then brought into contact with the prepared surface of the substrate at 312 by, for example, immersing the substrate in a solution containing the spheres or exposing the prepared surface to such a solution or slurry containing the microspheres. At this point, depending upon the materials and type of bonding, agitation, heating or other actions may be taken to enhance the speed or consistency of the bonding of the type A spheres to the substrate. Once a self-passivated (or otherwise equivalently self-limiting) single layer of spheres have bonded to the surface of the substrate, the excess type A spheres can be removed, for example by rinsing at 316.

If multiple layers of spheres are desired at 320, the process proceeds to 324 where a second type of spheres (type B) is brought into contact with the first layer of type A spheres bonded to the substrate. Type B spheres are spheres that bond to type A spheres but not to themselves. Again, depending upon the materials and type of bonding, agitation, heating or other actions may be taken to enhance the speed or consistency of the bonding of the type B spheres to the first layer of type A spheres. Once a self-passivated single layer of type B spheres have bonded to the layer of type A spheres on the substrate, the excess type B spheres can be removed, for example by rinsing at 328. If only two layers are desired at 332, the process is halted at 336. However, if additional layers are desired, one merely repeats 312 and 316 (with possible process adjustments to account for bonding between the two types of spheres rather than spheres to substrate).

This process can be repeated until a desired odd number of layers is reached at 320 or even number of layers is reached at 332, at which point the process can be halted at 336. Those skilled in the art will appreciate that the present exemplary embodiment uses two different complementary types of spheres, but this should not be considered limiting since the process can readily be expanded to as many types of spheres as desired. Moreover, the process can be used to build a desired structure and at a desired position insert a different type of sphere layer to achieve controlled layering of a third type of material at a particular location. Many variations will occur to those skilled in the art upon consideration of the examples provided herein without departing from the present invention.

Figure 8:
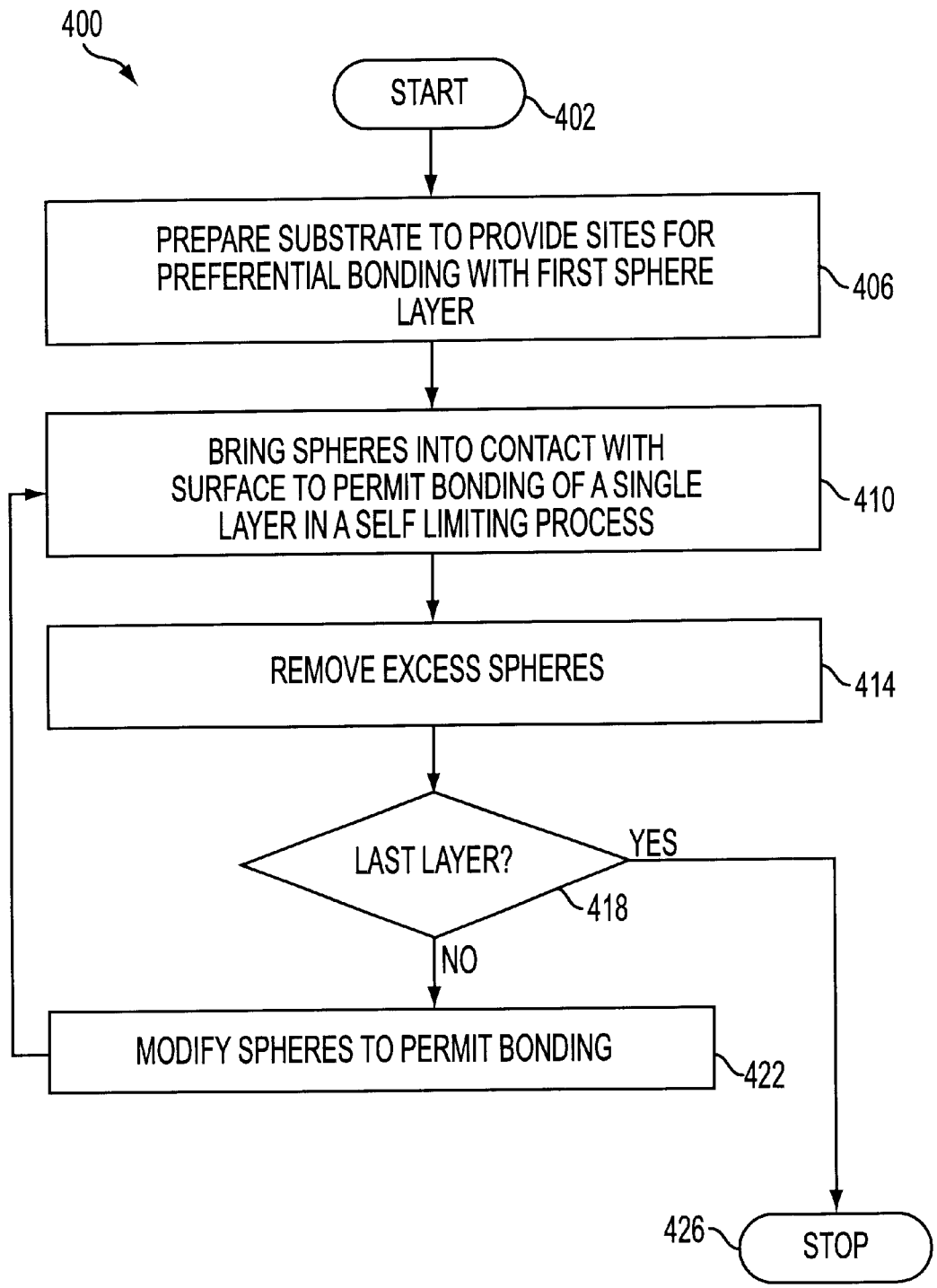
FIG. 8 is a flow chart depicting an alternative process for layer-by-layer fabrication of a photonic crystalline structure consistent with certain embodiments of the present invention.

In addition to the process described above, a variation of the process can be used (with or without the process above) to fabricate multi-layer photonic crystalline structures. FIG. 8 is a flow chart 400 describing one such variation of this process starting at 402. At 406 a suitable substrate is prepared or obtained so that spheres of a particular type will bond to the substrate in a manner dictated by the patterning or templating of the substrate as before. It is again hypothesized that a suitable bond can result from covalent bonding, electrostatic attraction, metallic bonding, hydrogen bonding, Van der Waals forces, hydrophobic/hydrophillic attractions, biological recognition such as protein-protein/protein-ligand complexes (e.g., antigen-antibody), DNA or RNA hybridization or ligand-receptor (e.g., enzyme-substrate), or some combination of the above forces, or any other suitable bond. The spheres are then brought into contact with the prepared surface of the substrate at 410 by, for example, immersing the substrate in a solution containing the spheres or exposing the prepared surface to such a solution or slurry containing the microspheres. At this point, depending upon the materials and type of bonding, agitation, heating or other actions may be taken to enhance the speed or consistency of the bonding of the spheres to the substrate. Once a self-passivated or otherwise self-limiting single layer of spheres have bonded to the surface of the substrate, the excess spheres can be removed, for example by rinsing at 414.

If additional layers are desired at 418, the layer of spheres bonded to the substrate are modified to permit bonding, either to the same kind of sphere or to another kind of sphere at 422. The process of 410, 414, 418 and 422 are then repeated until a crystal of desired size is achieved and the last layer is in place. The process is then halted at 426.

The process of FIG. 8 could be carried out, for example, using covalent bonding. Microspheres coated with phosphonate terminal groups have a 2-charge, and would exhibit self-passivation. When introduced to a solution containing $Cr_{4+}$ ions, these ions bond to the phosphonate groups, leaving them with a +2 charge. Subsequent exposure to phosphonated microspheres would add an additional layer to the crystalline structure. Thus, if phosphonated spheres are used in process 400, the spheres can be modified as in 422 to permit them to bond to one another by introduction of a solution containing $Cr^{4+}$ ions. Additional layers of phosphonated microspheres can then be built up to produce a photonic crystal made of a single type of sphere.

The process of FIG. 8 could also be carried out, for example, using biological recognition. One example of this type of process would use microspheres coated with biotin, and modified with streptavidin. At 410 a self-passivated layer of biotin-coated spheres is formed in a similar manner as described previously. Excess spheres are then removed by, for example, rinsing at 414. At 422, the spheres are exposed to a solution containing streptavidin, which bonds to the biotin-coated surface of the spheres. Each streptavidin protein contains four sites for bonding, and so three of those sites are still available for subsequent bonding with biotin-coated spheres after the initial bond. Additional layers of biotinylated microspheres can then be built up to produce a photonic crystal made up of a single type of sphere.

Note that the processes in FIG. 7 and FIG. 8 refer only to the bond types, so that other attributes of the microspheres, such as size, shape, and/or chemical composition, may vary within or between the layers. In addition, one could perform additional processing steps, for example introduction of defects within a layer, before proceeding to add subsequent layers to the crystal.

As previously described, it is believed that many types of bonds can be utilized (singly or in combination) to fabricate crystal structures consistent with certain embodiments of the present invention. Covalent coupling is a bonding technique that might be used to selectively deposit monolayers of spheres. Covalent coupling has the advantage of providing the largest bond strength of the techniques mentioned. In addition to the phosphonate/$Cr^{4+}$ linkage mentioned previously, numerous covalent coupling chemistries are well known. They are often used to covalently couple carboxyl- or amino-modified microspheres to molecules such as proteins which have terminal carboxyl and amino groups. Carboxyl- and amino-modified microspheres are available commercially from Bangs Labs, Inc (9025 Technology Drive, Fishers, Ind. 46038-2886) and other vendors. Several approaches for achieving covalent coupling between layers of microspheres in a photonic crystal are possible. Examples include linkages between carboxyl-modified microspheres and ligands with available amines using a water soluble carbodiimide. One skilled in the art will appreciate that, several approaches can be taken using this type of chemistry. One example would be to saturate a batch of carboxyl-modified microspheres with carbodiimide, and use this as microsphere type "A" in the process flow shown in FIG. 7. Then amino-modified microspheres could be used as microsphere type "B".

Another example of covalent coupling between microspheres using the process flow in FIG. 8 involves linkages between amino-modified microspheres using an amine-reactive homobifunctional cross-linker, such as glutaraldehyde. The glutaraldehyde cross-linker bonds to amine groups on both ends of the molecule. Several approaches in applying this to the formation of photonic crystals are possible. For example, after depositing a layer of amino-modified microspheres, the layer could then be activated using a cross-linker, according to the process flow in FIG. 8. A second approach would be to saturate a batch of amino-modified microspheres using the crosslinker and use this batch as type "A" microspheres, and then use the amino-modified microspheres without the crosslinker as type "B" microspheres, and follow the process flow in FIG. 7.

Numerous other examples of covalent coupling reactions are described in the literature involving, for example, hydroxyl, hydrazide, amide, chloromethyl, aldehyde, epoxy, and tosyl end groups, all of which are available commercially as functional groups on the surface of microspheres (e.g., from Bang Labs and other sources). Another example utilizes techniques involving the creation of self-assembled monolayers (SAMs). Such techniques involve exposing a type of molecule, usually in solution, to a surface which bonds to one endgroup of the molecule. The other endgroup may be functionalized for a variety of applications. Many other covalent coupling chemistries will occur to those skilled in the art upon consideration of the present teaching.

As previously described, many types of bonds can be utilized to fabricate crystal structures consistent with embodiments of the present invention. Electrostatic charge is another bonding technique that might be used to selectively deposit monolayers of spheres. Electrostatic bonds occur between ionized groups of opposite charge (e.g., carboxyl (—COO and amino (—$NH_3^+$)). It is preferred that spheres used in an electrostatic bonding embodiment have an electrostatic charge that is localized to the surface of the sphere. If the electrostatic charge is centralized, as the charge is shifted away from the center of the sphere, the spheres might cluster and lose the self-passivation quality desired for the present invention. Several approaches are possible for creating a charge localized to the surface of the sphere. Silica spheres naturally have a negative surface charge due to the Si—H terminations at the surface. Therefore the charge is inherently distributed on the sphere at the surface. Using this negative charge, it is relatively easy to coat the spheres leaving a positive charge, again distributed on the surface. Other examples of microspheres with alternative surface chemistries that exhibit electrostatic charges and are commercially available are polymeric microspheres with carboxyl surface groups, which are negative, and amine surface groups, which are positive. Alternatively, the electrostatic charge could be generated in several ways such as ion implantation or plasma processing. Other surface chemistries that exhibit electrostatic charge are consistent with certain embodiments of the present invention.

Another example consistent with certain embodiments of the present invention, takes advantage of a common technique in biomaterials research known as protein, RNA, DNA, or more generally, biological recognition. A protein, RNA or DNA strand is bound to a surface, and when exposed to the antigen, complementary RNA or DNA strand, or RNA or DNA binding protein the two compatible materials are strongly bound to each other. This is normally detected by techniques such as fluorescence or surface plasmon resonance spectroscopy. The same approach could be applied to spheres, with alternating layers of spheres having surfaces composed of protein and antigen, respectively for example. An advantage of this approach is the high selectivity provided by the proteins or DNA. A potential advantage of DNA or RNA coupling between microspheres is that the length of the strands can be selected over a wide range of lengths. This could allow tuning of the lattice parameters of the crystal independent of sphere size. Also, the strands are elastic compared to most molecules, which could allow easier tuning of the photonic bandgap by mechanical stretching.

Using biological recognition, as described previously, a photonic crystal could be formed by using alternating layers of biotin- and streptavidin-coated spheres, respectively. Alternatively, a photonic crystal could be formed using only one type of microsphere, in this case biotin-coated microspheres, such that after each layer is deposited, the microspheres are treated with a complementary molecule, in this case streptavidin, such that they are activated to bond with a subsequent layer of microspheres.

Another use of biological recognition could involve one layer functionalized with a single strand DNA or RNA and the following layer a complementary (antisense) oligonucleotide strand. Similarly, alternating layers providing antibody/antigen binding could be used, e.g. with protein A and IgA, or protein G and IgG. Enzyme and substrate binding is normally temporary, but this binding could be used between alternating layers by locking the molecules in an intermediate bound state by using appropriate buffer conditions.

Many of the bond types described previously are typically produced in solution, but many, such as phosphonate/chromium bonds, can be dried after bonding occurs. This means that no matrix, liquid or solid, is necessary to bind the crystal together, although one could be used if desired or if otherwise beneficial. Removing the matrix material may significantly improve the index of refraction contrast between the spheres and surrounding medium (air), which is a major factor in the optical behavior of the crystalline structure. A table of common materials used as microspheres and/or matrix is given below. Removal of the matrix also improves the ability to introduce arbitrary liquid or vapor phase environments to the crystal so that it can more easily be used as a sensor. Removal of the liquid matrix would also allow infiltration and densification of the volume between microspheres with semiconductors or metals, which has been demonstrated using the traditional colloidal approach. Subsequent removal of the microspheres is then possible.

| Material | Index of refraction |
|---|---|
| Air | 1.00 |
| Water | 1.33 |
| Silica | 1.46 |
| Polystyrene | 1.59 |

There are several benefits to use of the methods described above. For example, with proper experimental conditions, defect levels are expected to be much lower than for traditional colloidal techniques. Also, traditional colloidal techniques are limited to sphere sizes in the 800–1000 nm range or smaller, because sedimentation effects become important for larger spheres. Because the current approach builds the crystal a single layer at a time, sedimentation is not a concern. This should allow larger spheres to be used so that crystals with optical features in the mid- and far-infrared can be fabricated. As mentioned previously, substrate templating and proper sphere size selection can allow more complex crystal structures than were previously possible. For example, non-close-packed structures such as body-centered cubic, tetragonal, and monoclinic structures can be designed and fabricated. Also, the crystals can be integrated into optical systems on a wafer scale, and batch processing should make the process very cost-efficient.

Thus, in accordance with certain embodiments, the current invention provides several new techniques for the fabrication of photonic crystals composed of small particles, such as spheres. This layer-by-layer approach as described herein allows one to tailor the properties of the crystalline structure in ways not previously possible, which could not only speed the development of commercially viable crystals, but allow the design of structures with new functionality.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, permutations, modifications and variations as fall within the scope of the appended claims.

What is claimed is:

1. A method of fabricating a photonic crystal, comprising:
   providing a templated substrate;
   exposing the templated substrate to a plurality of first microspheres made of a first material, the first material being of a type that will bond to the templated substrate and form a self-passivated layer of first microspheres to produce a first layer.

2. The method according to claim 1, further comprising:
   exposing the first layer to a plurality of second microspheres made of a second material, the second material being of a type that will bond to the first layer and form a self-passivated second layer of second microspheres.

3. The method according to claim 2, further comprising:
   exposing the second layer to a plurality of the first microspheres made of a the first material, the first material being of a type that will bond to the second layer and form a self-passivated layer of first microspheres.

4. The method according to claim 2, further comprising:
   repeatedly exposing a most recently formed layer to microspheres to a plurality of microspheres that will bond to the most recently formed layer and self-passivate to fabricate a multiple layer photonic crystal.

5. The method according to claim 2, wherein the first microspheres comprise streptavidin-coated microspheres and the second microspheres comprise biotin coated microspheres.

6. The method according to claim 5, wherein the substrate is templated by providing regions of biotinylated regions on a surface of the substrate.

7. The method according to claim 2, wherein the first microspheres comprise biotin-coated microspheres and the second microspheres comprise streptavidin-coated microspheres.

8. The method according to claim 2, wherein providing a templated substrate comprises forming a geometric pattern in the substrate material to create preferential bonding regions on the substrate.

9. The method according to claim 2, wherein providing a templated surface comprises forming three-dimensional topography on a surface of the substrate to create preferential bonding regions within the topography.

10. The method according to claim 2, wherein providing a templated substrate comprises forming inverted pyramid shaped recesses on a surface of the substrate material to create preferential bonding regions within the inverted pyramids.

11. The method according to claim 2, wherein providing a templated substrate comprises chemically treating the substrate to create preferential bonding regions on the substrate.

12. The method according to claim 2, wherein providing a templated substrate comprises creating preferential bonding regions on the substrate by a combination of chemical and topographical patterning.

13. The method according to claim 2, wherein the bond comprises at least one of covalent bonding, electrostatic attraction, metallic bonding, hydrogen bonding, Van der Waals forces, hydrophobic/hydrophillic attractions and biological recognition.

14. The method according to claim 2, wherein one of the first and second microspheres have DNA strands on a surface thereof, and wherein the other of the first and second microspheres have at least one of complimentary DNA strands, complimentary RNA strands, oligonucleotides and DNA binding proteins on a surface thereof.

15. The method according to claim 2, wherein one of the first and second microspheres have RNA strands on a surface thereof, and wherein the other of the first and second microspheres have at least one of complimentary DNA strands, complimentary RNA strands, oligonucleotides and RNA binding proteins on a surface thereof.

16. The method according to claim 2, wherein one of the first and second microspheres have a protein situated on a surface thereof, and wherein the other of the first and second microspheres have at least one of an antigen and a ligand that bonds to the protein on a surface thereof.

17. The method according to claim 2, wherein the first microspheres have a first molecule with a first endgroup on a surface thereof, and wherein the second microspheres have a second molecule with a second endgroup on a surface thereof, wherein the first and second molecules bond to each other, but not to themselves, by formation of one of a covalent, ionic, metallic, hydrogen and Van der Waals bond.

18. The method according to claim 2, wherein one of the first and second microspheres have a bulk electrostatic charge or a surface electrostatic charge of a first charge state, and wherein the other of the first and second microspheres have a second bulk electrostatic charge or surface electrostatic charge with a second charge state which is opposite and attractive to the first charge state, wherein the first and second microspheres bond to each other by formation of ionic/electrostatic bonds, but do not bond to themselves.

19. The method according to claim 2, further comprising processing the first layer to form a surface that will bond to the second microspheres prior to exposing the first layer to the plurality of microspheres.

20. A method of fabricating a photonic crystal, comprising:
   a) providing a templated substrate;
   b) exposing the templated substrate to a plurality of first microspheres made of a first material, the first material being of a type that will bond to the templated substrate and form a self-passivated layer of first microspheres to produce a layer of microspheres;
   c) modifying the first layer of microspheres to permit the first layer of microspheres to bond with other microspheres to thereby produce a bondable layer;
   d) exposing the bondable layer to a plurality of second microspheres to form a second layer of microspheres.

21. The method according to claim 20, wherein the plurality of second microspheres are made of the first material.

22. The method according to claim 20, wherein the plurality of second microspheres are made of a second material.

23. The method according to claim 20, further comprising:
   modifying the second layer of microspheres to permit the second layer of microspheres to bond with other microspheres and thereby produce a second bondable layer;
   exposing the second bondable layer to a plurality of microspheres to form a third self-passivated layer of microspheres to produce a three layer photonic crystal.

24. The method according to claim 20, further comprising repeating c) and d) a plurality of times to achieve a desired number of layers of a photonic crystal.

25. The method according to claim 20, wherein providing a templated substrate comprises forming a geometric pattern in the substrate material to create preferential bonding regions on the substrate.

26. The method according to claim 20, wherein providing a templated substrate comprises forming three dimensional topography a surface of the substrate material to create preferential bonding regions on the topography.

27. The method according to claim 20, wherein providing a templated substrate comprises forming inverted pyramid shaped recesses on a surface of the substrate material to create preferential bonding regions within the inverted pyramids.

28. The method according to claim 20, wherein providing a templated substrate comprises chemically treating the substrate to create preferential bonding regions on the substrate.

29. The method according to claim 20, wherein providing a templated substrate comprises creating preferential bonding regions on the substrate by a combination of chemical and topographical patterning.

30. The method according to claim 20, wherein the bond comprises at least one of covalent bonding, electrostatic attraction, metallic bonding, hydrogen bonding, Van der Waals forces, hydrophobic/hydrophillic attractions and biological recognition.

31. The method according to claim 20, wherein providing a templated substrate comprises at least one of mechanically templating a substrate and chemically templating the substrate.

32. A photonic crystal structure, comprising:
 a templated substrate processed to bond preferentially to a first material in selected areas;
 a first layer of first microspheres, the first layer being one microsphere deep, the first microspheres comprising the first material and bonded to the selected areas of the templated substrate.

33. The apparatus according to claim 32, wherein the substrate is templated by providing biotinylated regions on a surface of the substrate.

34. The apparatus according to claim 32, wherein the substrate is templated by forming a geometric pattern in the substrate material to create preferential bonding regions on the substrate.

35. The apparatus according to claim 32, wherein the substrate is templated by forming a three dimensional topography on a surface of the substrate to create preferential bonding regions on the topography.

36. The apparatus according to claim 32, wherein the substrate is templated by forming inverted pyramid shaped recesses on a surface of the substrate to create preferential bonding regions within the inverted pyramids.

37. The apparatus according to claim 32, wherein the substrate is templated by chemically treating the substrate to create preferential bonding regions on the substrate.

38. The apparatus according to claim 32, wherein the substrate is templated by creating preferential bonding regions on the substrate using a combination of chemical and topographical patterning.

39. The apparatus according to claim 32, further comprising a second layer of second microspheres one microsphere deep and bonded to the first layer of microspheres.

40. The apparatus according to claim 39, wherein one of the first and second microspheres comprise streptavidin-coated microspheres and the other of the first and second microspheres comprise biotin coated microspheres.

41. The apparatus according to claim 39, wherein one of the first and second microspheres have RNA strands on a surface thereof, and wherein the other of the first and second microspheres have at least one of complimentary DNA strands, complimentary RNA strands, oligonucleotides and RNA binding proteins on a surface thereof.

42. The apparatus according to claim 39, wherein the one of the first and second microspheres have DNA strands on a surface thereof, and wherein the other of the first and second microspheres have at least one of complimentary DNA strands, complimentary RNA strands, oligonucleotides and DNA binding proteins on a surface thereof.

43. The apparatus according to claim 39, wherein one of the first and second microspheres have a protein situated on a surface thereof, and wherein the other of the first and second microspheres have at least one of an antigen and a ligand that bonds to the protein on a surface thereof.

44. The apparatus according to claim 39, wherein first microspheres have a first molecule on a surface thereof, and wherein the second microspheres have a second molecule on a surface thereof, wherein the first and second molecules bond to each other but not to themselves.

45. The apparatus according to claim 39, wherein the first microspheres have a first bulk or surface electrostatic charge, and wherein the second microspheres have a second bulk or surface electrostatic charge which is opposite and attractive to the first electrostatic charge, wherein the first and second microspheres bond to each other but not to themselves.

46. The apparatus according to claim 39, wherein the bond comprises at least one of covalent bonding, electrostatic attraction, metallic bonding, hydrogen bonding, Van der Waals forces, hydrophobic/hydrophillic attractions and biological recognition.

47. The apparatus according to claim 39, wherein the second microspheres are comprised of a second material.

48. The apparatus according to claim 32, wherein the second microspheres are comprised of the first material.

49. A method of fabricating a photonic crystal, comprising:
 providing a templated substrate;
 bonding a single layer of microspheres one microsphere deep to the templated substrate to form a first layer; and
 bonding a single layer of microspheres one microsphere deep to the first layer to form a second layer.

50. The method according to claim 49, further comprising repeatedly bonding a layer of microspheres one microsphere deep to a most recently formed layer to produce a multiple layer photonic crystal.

51. The method according to claim 50, wherein the bond comprises at least one of covalent bonding, electrostatic attraction, metallic bonding, hydrogen bonding, Van der Waals forces, hydrophobic/hydrophillic attractions and biological recognition.

52. The method according to claim 50, further comprising modifying the most recently formed layer to cause the layer to bond with a next layer of microspheres.

53. The method according to claim 49, wherein providing a templated substrate comprises creating preferential bonding regions on the substrate by at least one of chemical and topographical patterning.

54. The method according to claim 49, wherein alternating layers of the multiple layer photonic crystal are comprised of microspheres of differing types.

55. A photonic crystal structure, comprising:
 a substrate having a surface;
 a biotinylated gold pattern residing on the surface of the substrate in selected areas to define regions of preferential bonding to streptavidin;
 a first layer of microspheres, the first layer being one microsphere deep, the microspheres comprising streptavidin-coated microspheres that are bonded to the selected areas of the substrate;
 a second layer of microspheres, the second layer being one microsphere deep, the microspheres comprising biotin-coated microspheres that are bonded to the first layer of microspheres; and
 a third layer of microspheres, the third layer being one microsphere deep, the microspheres comprising streptavidin-coated microspheres that are bonded to the second layer of microspheres.

* * * * *